(12) United States Patent
Li et al.

(10) Patent No.: US 10,756,240 B2
(45) Date of Patent: Aug. 25, 2020

(54) RGB-LED PACKAGING MODULES AND DISPLAY SCREEN FORMED THEREOF

(71) Applicant: Shandong Jierunhong Optoelectronics Co., Ltd., Tai'an, Shandong (CN)

(72) Inventors: Shaoli Li, Shandong (CN); Changhui Sun, Shandong (CN); Yiping Kong, Shandong (CN)

(73) Assignee: Shandong Jierunhong Optoelectronics Co., Ltd., Tai'an (CN)

( * ) Notice: Subject to any disclaimer, the term of this patent is extended or adjusted under 35 U.S.C. 154(b) by 0 days.

(21) Appl. No.: 16/285,159

(22) Filed: Feb. 25, 2019

(65) Prior Publication Data

US 2019/0280163 A1  Sep. 12, 2019

(30) Foreign Application Priority Data

Feb. 26, 2018 (CN) .................... 2018 2 0271395 U
Feb. 26, 2018 (CN) .................... 2018 2 0271614 U
Feb. 26, 2018 (CN) .................... 2018 2 0275846 U

(51) Int. Cl.
*H01L 33/50* (2010.01)
*G02B 5/00* (2006.01)
(Continued)

(52) U.S. Cl.
CPC ............ *H01L 33/501* (2013.01); *G02B 5/003* (2013.01); *H01L 25/0753* (2013.01);
(Continued)

(58) Field of Classification Search
CPC ....... H01L 33/501; H01L 33/36; H01L 33/58; H01L 25/0753; G02B 5/003; H05B 45/20
(Continued)

(56) References Cited

U.S. PATENT DOCUMENTS

2011/0096045 A1  4/2011  Ito et al.
2020/0013759 A1*  1/2020  Yoo ......................... H01L 33/62

FOREIGN PATENT DOCUMENTS

CN   106847800 A   6/2017
CN   106847801 A   6/2017
(Continued)

OTHER PUBLICATIONS

Search Report of counterpart European Patent Application No. 19159052.0 dated Jul. 3, 2019.

*Primary Examiner* — Tu-Tu V Ho

(57) ABSTRACT

The present disclosure provides RGB-LED packaging modules and a display screen including a substrate; a plurality of light-emitting units disposed on the substrate, each light-emitting unit including a set of RGB-LED chips; a plastic layer provided on the light-emitting units; and a virtual isolating region provided between the light-emitting units, the virtual isolating region including a black light-absorbing layer provided on the substrate. The present disclosure makes use of the black light-absorbing layer to absorb light which may cause interference among the light-emitting units. By providing the virtual isolating region and an isolating trough, and utilizing the difference of refractive index of packaging plastic and refractive index of air, light emitted by the light-emitting units can be reflected to reduce the influence of adjacent light-emitting units. A black isolating-frame is filled in the isolating trough to minimize the interference among the light-emitting units.

15 Claims, 8 Drawing Sheets

(51) Int. Cl.
　　　*H01L 33/36*　　　(2010.01)
　　　*H01L 25/075*　　(2006.01)
　　　*H05B 45/20*　　　(2020.01)
　　　*H01L 33/58*　　　(2010.01)

(52) U.S. Cl.
　　　CPC ............. *H01L 33/36* (2013.01); *H05B 45/20* (2020.01); *H01L 33/58* (2013.01)

(58) Field of Classification Search
　　　USPC .......................................................... 257/98
　　　See application file for complete search history.

(56) References Cited

FOREIGN PATENT DOCUMENTS

| | | |
|---|---|---|
| KR | 20170101056 A | 9/2017 |
| WO | 2004032235 A2 | 4/2004 |

\* cited by examiner

RGB-LED PACKAGING MODULES AND DISPLAY SCREEN FORMED THEREOF

CROSS REFERENCE TO RELATED APPLICATIONS

The present application claims the benefit of Chinese Patent Application Nos. 201820271395.2 filed on Feb. 26, 2018, 201820271614.7 filed on Feb. 26, 2018, and 201820275846.X filed on Feb. 26, 2018. All the above are hereby incorporated by reference.

TECHNICAL FIELD

The present disclosure relates to SMD (Surface Mount Device) LED packaging technology, and in particular to RGB-LED packaging modules and a display screen formed thereof.

BACKGROUND TECHNOLOGY

In the existing SMD LED manufacturing, products generally adopt the PLCC4 structure (such as 3528, 2121, 1010, etc.). However, the above structure exists individually. In actual production, it can only be attached one by one. As such, the production efficiency is low and maintenance is difficult. Especially in the production of LED display screens, the number of LEDs used is usually in the order of tens of thousands or even millions. When producing small-sized products, such as format 1.0 mm*1.0 mm and below, difficulty of production will be multiplied, mechanical strength of the product will be very low, damage will easily happen under action of external force, production efficiency will be low, and requirement for mounting equipment will be high. For the one by one mounting problem, the applicant has adopted the form of a packaging module, i.e. multiple sets of RGB-LED chips are packaged on the same module, as disclosed in Chinese Patent applications with Publication Nos. CN106847801A and CN106847800A. However, the above Patent applications may have some problems in actual production. As shown in FIG. 1, in the packaging module, since the LED light is diffused, light emitted from adjacent light-emitting units will be interfered. Since a single light-emitting unit emits light formed from a mixture of three kinds (RGB) of chips, if the light from adjacent light-emitting units causes interference, it will directly affect the light that is mixed, thereby affecting the definition and sharpness. In addition, when using this kind of packaging module, the number of solder pads on the back of the module will be very large. For example, for a four-piece RGB-LED packaging module, each having four sets of RGB-LED chips, the number of back solder pad is up to 16. In case of a small space, this greatly increases the difficulty of PCB design and the difficulty of soldering.

Therefore, the prior art has yet to be improved and developed.

SUMMARY OF THE DISCLOSURE

The object of the present disclosure is to provide an RGB-LED packaging module and a display screen made thereof which are intended to solve the problems of existing RGB-LED packaging module, such as interference of light from adjacent light-emitting units, effect on definition, large number of pins, and complicated circuit design.

In order to solve the above problems, the technical solution of the present disclosure is as follows:

An RGB-LED packaging module includes a substrate; a plurality of light-emitting units disposed on the substrate, each light-emitting unit including a set of RGB-LED chips; a plastic layer provided on the light-emitting units; and a virtual isolating region provided between the light-emitting units, the virtual isolating region including a dark light-absorbing layer provided on the substrate.

In the RGB-LED packaging module, the dark light-absorbing layer is in one of the colors black, dark gray, dark purple, green black, dark blue and dark brown.

In the RGB-LED packaging module, the dark light-absorbing layer includes an adhesive and a black light-absorbing material, and the adhesive includes organic silica gel, epoxy resin, or a combination thereof, and the black light-absorbing material includes carbon black, graphite, carbon nanotube, melanin, iron black, graphene, other black light-absorbing material of the same type, or a combination thereof.

In the RGB-LED packaging module, the virtual isolating region further includes an isolating trough disposed between the light-emitting units.

In the RGB-LED packaging module, the virtual isolating region further includes a black isolating frame filled in the isolating trough.

In the RGB-LED packaging module, the black isolating frame has a width and a height that are equivalent to those of the isolating trough, and the black isolating frame is filled with one or more of carbon black, graphite, carbon nanotubes, melanin, iron black, and graphene.

In the RGB-LED packaging module, the RGB-LED chip is an upright chip, a vertical chip, or a flip chip, and includes a red light chip, a green light chip, and a blue light chip.

In the RGB-LED packaging module, the number of the light-emitting units is four, and the RGB-LED chip includes a set of red light, green light and blue light chips, each chip being provided with a first electrode and a second electrode for supplying power, the first electrode having common anodes or common cathodes, the second electrode having an opposite polarity of the first electrode, wherein the four light-emitting units are paired up to form two pairs of light-emitting units, the first electrodes of all of the red light chips, green light chips and blue light chips of each pair of light-emitting units are electrically connected, and the second electrodes of one pair of light-emitting units are electrically connected in one-to-one correspondence with the second electrodes of the red light chips, green light chips and blue light chips of the other pair of light-emitting units; a back side of the substrate is provided with a plurality of lower solder pads; and the first electrodes and the second electrodes are led out through the lower solder pads and connected to an external circuit.

In the RGB-LED packaging module, a front side of the substrate is provided with patterning circuit layers connected with a plurality of lower solder pads through a plurality of conductive holes passing through the substrate.

In the RGB-LED packaging module, the substrate is a multi-layered board, and at least one circuit layer is disposed in between the substrate, wherein the front side of the substrate, the lower solder pads, and the circuit layer are electrically connected through the conductive hole.

An RGB-LED packaging module includes:
a substrate, a front side of the substrate being provided with patterning circuit layers including a plurality of functional regions, a plurality of lower solder pads provided on a back side of the substrate, each functional region corresponding to one lower solder pad, and connected through a conductive hole passing through the substrate;

four light-emitting units, the four light-emitting units arranged in a square array on the front side of the substrate, each light-emitting unit including a red-light chip, a blue light chip and a green light chip;

a light-transmitting plastic layer, the light-transmitting plastic layer being wrapped around the four light-emitting units on the substrate;

wherein the functional regions include first and second red light chip connecting regions, first and second blue light chip connecting regions, first and second green light chip connecting regions, and first and second common polarity regions, each chip of the light-emitting units is provided with a first electrode and a second electrode, the second electrode is opposite in polarity to the first electrode, wherein the first electrodes of all of the chips in a first row of the light-emitting units are electrically connected to the first common polarity region, the first electrodes of all of the chips in a second row of the light-emitting units are electrically connected to the second common polarity region, the second electrodes of the red light chips in a first column of the light-emitting units are electrically connected to the first red light chip connecting region, the second electrodes of the red light chips in a second column of the light-emitting units are electrically connected to the second red light chip connecting region, the second electrodes of the blue light chips in the first column of the light-emitting units are electrically connected to the first blue light chip connecting region, the second electrodes of the blue light chips in the second column of the light-emitting units are electrically connected to the second blue light chip connecting region, the second electrodes of the green light chips in the first column of the light-emitting units are electrically connected to the first green light chip connecting region, the second electrodes of the green light chips in the second column of the light-emitting units are electrically connected to the second green light chip connecting region.

In the RGB-LED packaging module, a virtual isolating region is provided between the light-emitting units, and the virtual isolating region includes a dark light-absorbing layer provided on the substrate.

In the RGB-LED packaging module, the red-light chip has a structure of a vertical chip, and the green light chip and the blue light chip have a structure of an upright chip.

In the RGB-LED packaging module, all the chips of the two light-emitting units in the first column are die-bonded on the first red light chip connecting region; and all the chips of the two light-emitting units in the second column are die-bonded on the second red light chip connecting region.

In the RGB-LED packaging module, all the chips of the two light-emitting units in the first row are die-bonded on the first common polarity region; and all the chips of the two light-emitting units in the second row are die-bonded on the second common polarity region.

In the RGB-LED packaging module, the red-light chips, the blue light chips, and the green light chips are flip chips.

An RGB-LED display screen includes a plurality of RGB-LED packaging modules, each RGB-LED packaging module including a substrate; a plurality of light-emitting units disposed on the substrate, each light-emitting unit including a set of RGB-LED chips; a plastic layer provided on the light-emitting units; and a virtual isolating region provided between the light-emitting units, the virtual isolating region including a dark light-absorbing layer provided on the substrate.

In the RGB-LED display screen, the virtual isolating region has a width that is equivalent to a distance between adjacent RGB-LED packaging modules.

The beneficial effects of the RGB-LED packaging modules and the display screen made thereof provided by the present disclosure include: (1) by providing a virtual isolating region, the black light-absorbing layer can be used to absorb light which may interfere with each other among the light-emitting units; and by providing an isolating trough and making use of the difference of refractive index of air and the packaging plastic, light emitted from the light-emitting units can be reflected to reduce the influence on adjacent light-emitting units; and furthermore, by filling the isolating trough with a black isolating frame, the interference among light-emitting units can be minimized; (2) by integrating four light-emitting units into one packaging module, production efficiency of LEDs in subsequent applications can be greatly improved, and can greatly reduce the production cost; (3) by arranging four light-emitting units in a square array, each light-emitting unit has two cutting edges and two common sides, and has unified independent pixels which can ensure the consistency of the illuminating effect; (4) having fewer light-emitting units, it can effectively avoid the problems of colour difference and poor consistency of the whole screen due to the difference of central values of the chips or the difference in the inks of the substrate from different batches of chips; (5) by changing the electrical connection relationship among the light-emitting units, the number of electrodes of the packaging modules and the number of lower solder pads can be reduced by many folds, to facilitate subsequent testing of the packaging modules, and further reduce the number of layers of PCB, so that subsequent circuit design can be simple and convenient, and subsequent mounting of packaging modules on the LED display screen is easy, which is especially suitable for products within small spacing; and (6) by providing a multi-layer substrate, the connecting circuits are provided inside the substrate rather than on the front side of the substrate, thereby avoiding the occurrence of layer separation caused by separation with the plastic layer on the front side. This greatly improves the airtightness of the packaging module and prolongs its service life.

Figure 1:
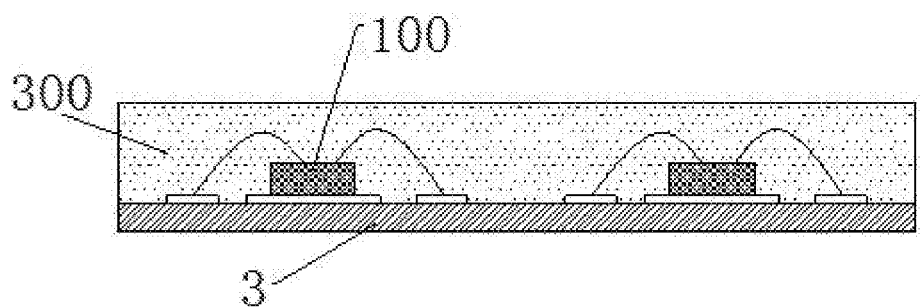
FIG. 1 is a cross-sectional view of a conventional RGB-LED packaging module.

DESCRIPTION OF THE REFERENCE SIGNS 1, first pair of light-emitting units; 11, first light-emitting unit; 1101, first red light chip; 1102, first green light chip; 1103, first blue light chip; 12, second light-emitting unit; 1201, second red light chip; 1202, second green light chip; 1203, second blue light chip; 2, second pair of light-emitting units; 21, third light-emitting unit; 2101, third red light chip; 2102, third green light chip; 2103, third blue light chip; 22, fourth light-emitting unit; 2201, fourth red light chip; 2202, fourth green light chip; 2203, fourth blue light chip; 3, substrate; 301, functional region; 3011, first common polarity region; 3012, second common polarity region; 3013, first red light chip connecting region; 3014, second red light chip connecting region; 3015, first green light chip connecting region; 3016, second green light chip connecting region; 3017, first blue light chip connecting region; 3018, second blue light chip connecting region; 4, lower solder pad; 5, through-hole; 6, RGB-LED packaging module; 7, RGB-LED display screen; 8, first electrode; 9, second electrode; 100, RGB-LED chip; 200, light-emitting unit; 300, light-transmitting plastic layer; 400, black light-absorbing layer; 500, isolating trough; 600, black isolating frame; 700, virtual isolating region.

DETAILED DESCRIPTION OF THE EMBODIMENTS

The embodiments of the present disclosure are described in detail below and illustrated in the drawings, wherein the same or similar reference numerals indicate the same or similar elements or elements having the same or similar functions. The embodiments described below with reference to the drawings are intended to be illustrative of the disclosure and are not to be construed as limiting.

The following disclosure provides many different embodiments or examples for implementing different structures of the present disclosure. In order to simplify the description of the present disclosure, the components and arrangement of the specific embodiments are described below. Of course, they are merely examples and are not intended to limit the present disclosure. In addition, the numerals and/or reference numerals of the elements of the present disclosure may be repeated in the various embodiments, which are for the purpose of simplicity and clarity, and do not indicate the relationship between the various embodiments and/or arrangements discussed. Moreover, the present disclosure provides examples of various specific processes and materials, and a person of ordinary skill in the art will recognize the use of other processes and/or the use of other materials.

Figure 2:
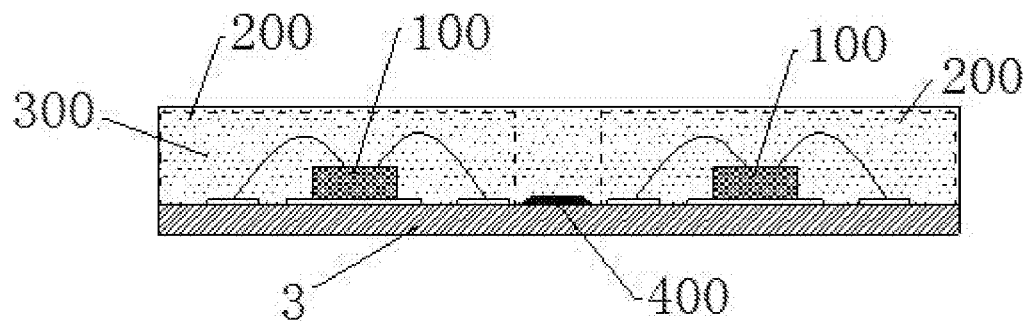
FIG. 2 is a cross-sectional view of an RGB-LED packaging module provided in the present disclosure.

FIG. 2 to FIG. 5 show several embodiments of the RGB-LED packaging module of the present disclosure. As shown in FIG. 2, the embodiment may include a substrate 3 and a plurality of light-emitting units 200 disposed on the substrate 3. In the present embodiment, the number of the light-emitting units 200 is two, and each of the light-emitting units 200 may include a set of RGB-LED chips 100. The light-emitting units 200 may be provided thereon with a light-transmitting plastic layer 300. In one embodiment, the light-transmitting plastic layer can be an epoxy resin layer. A virtual isolating region may be disposed between the light-emitting units 200. The virtual isolating region may include a dark light-absorbing layer provided on the substrate 3. In the present embodiment, the dark light-absorbing layer may be a black light-absorbing layer 400. The black light-absorbing layer 400 can be used to absorb light between the light-emitting units that may cause interference to each other. Although the black light-absorbing layer 400 does not actually form an isolation between the light-emitting units 200, it can absorb the lateral interfering light between the light-emitting units 200, thereby forming a virtual isolating region.

Preferably, the dark light-absorbing layer is in one of the colors black, dark gray, dark purple, green black, dark blue and dark brown.

Preferably, the black light-absorbing layer 400 may include carbon black, graphite, carbon nanotube, melanin, iron black, graphene, or a combination thereof. The above materials have excellent light absorption effects and are capable of effectively absorbing interfering light.

In the present embodiment, the light-transmitting plastic layer 300 can also be selected from other materials such as silica gel, modified silica gel, and modified epoxy resin. The presence of the light-transmitting plastic layer 300 can form a protection for the light-emitting units 200. It can increase the mechanical strength of the packaging module and can be beneficial to improve luminous efficiency.

In actual production, the RGB-LED chip 100 may include a red light chip, a green light chip, and a blue light chip, which may be any one of an upright chip, a vertical chip, or a flip chip. In the present embodiment, the RGB-LED chip 100 is an upright chip, and electrical connection may be formed by wire bonding.

Figure 3:
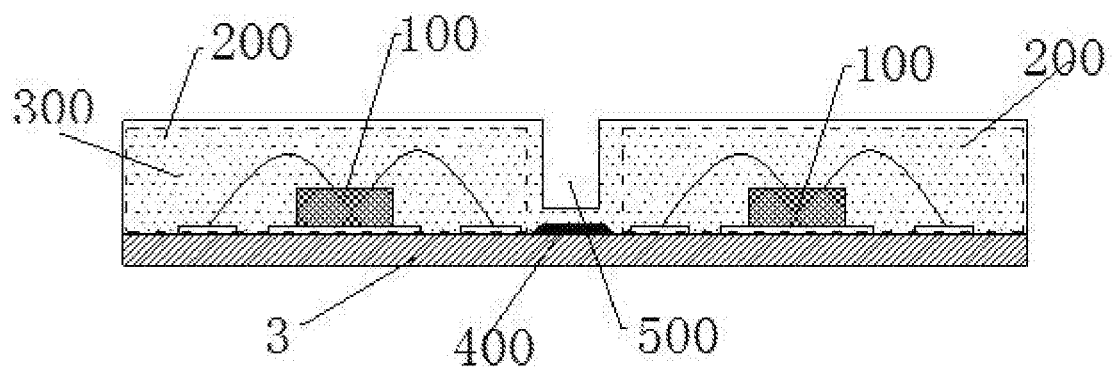
FIG. 3 is a cross-sectional view of another RGB-LED packaging module provided in the present disclosure.

Referring to FIG. 3, in addition to the black light-absorbing layer 400, an isolating trough 500 may be disposed between the light-emitting units 200. Due to the presence of the isolating trough 500, a part of the light emitting from the light-emitting units can be totally reflected so that interference among the light-emitting units can be effectively reduced.

Figure 4:
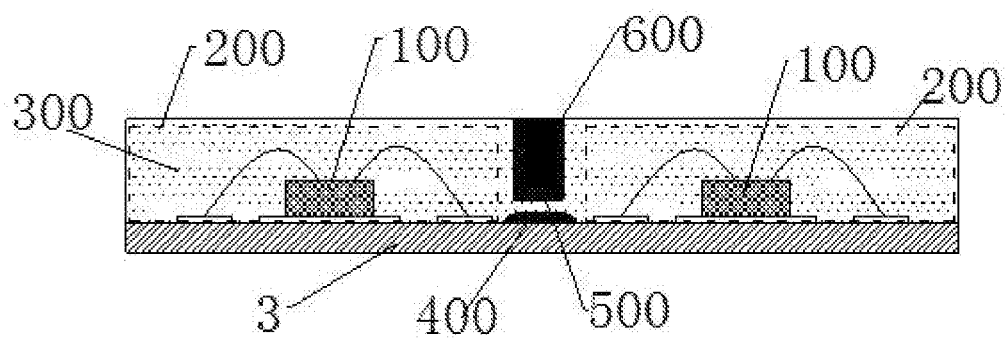
FIG. 4 is a cross-sectional view of another RGB-LED packaging module provided in the present disclosure.
Figure 5:
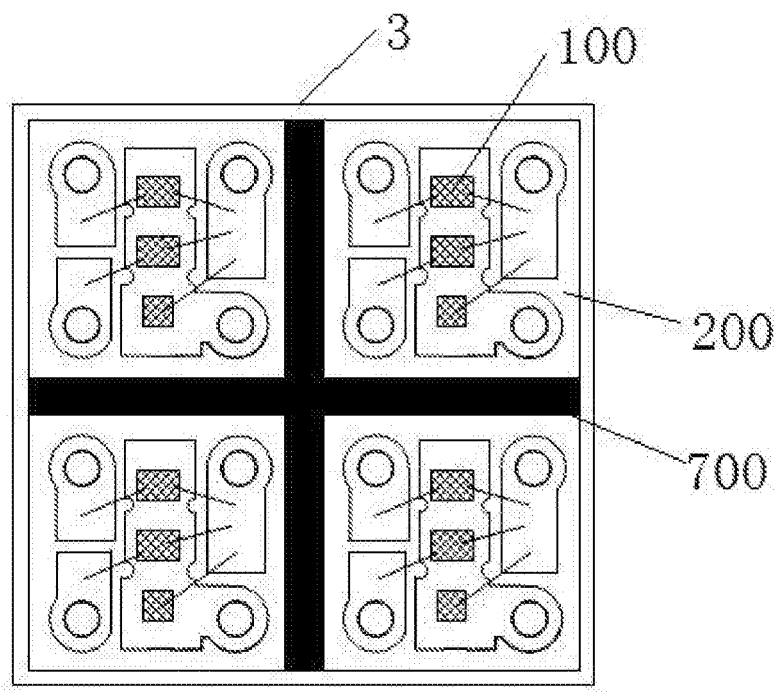
FIG. 5 is a front side view of another RGB-LED packaging module provided in the present disclosure.

Referring to FIG. 4 and FIG. 5, in order to further enhance the effect of absorbing and reflecting light on the basis of the above embodiment, the isolating trough 500 may be filled with a black isolating frame 600 having light-absorbing effect. In practical applications, the width and height of the black isolating frame 600 may be consistent with the width and height of the isolating trough 500 in order to maintain uniformity of the height of the entire packaging module. The black isolating frame 600 may be mixed with one or more of carbon black, graphite, carbon nanotubes, melanin, iron black, and graphene to enhance its light-absorbing ability.

When the product is produced, the production process may be as follows: firstly, carrying out die attachment and wire bonding on the substrate, setting the RGB-LED chips, coating a black light-absorbing layer between the light-emitting units, molding a plastic layer on the light-emitting units, cutting the plastic layer to form an isolating trough or forming the isolating trough during molding, filling the isolating trough with a black isolating frame by dispensing or injection, and finally cutting the product to form the RGB-LED packaging modules.

Figure 6:
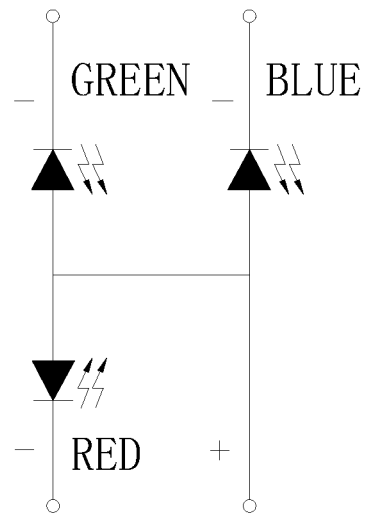
FIG. 6 is an electrical connection diagram of a conventional RGB-LED.

FIG. 6 shows an electrical connection diagram of a conventional RGB-LED, in which three chips of RGB-LED are connected in parallel, a common anode, and the other end of the three chips are separately led out, thereby forming four pins, As the number of RGB-LEDs increases, the number of pins will increase dramatically.

Figure 7:
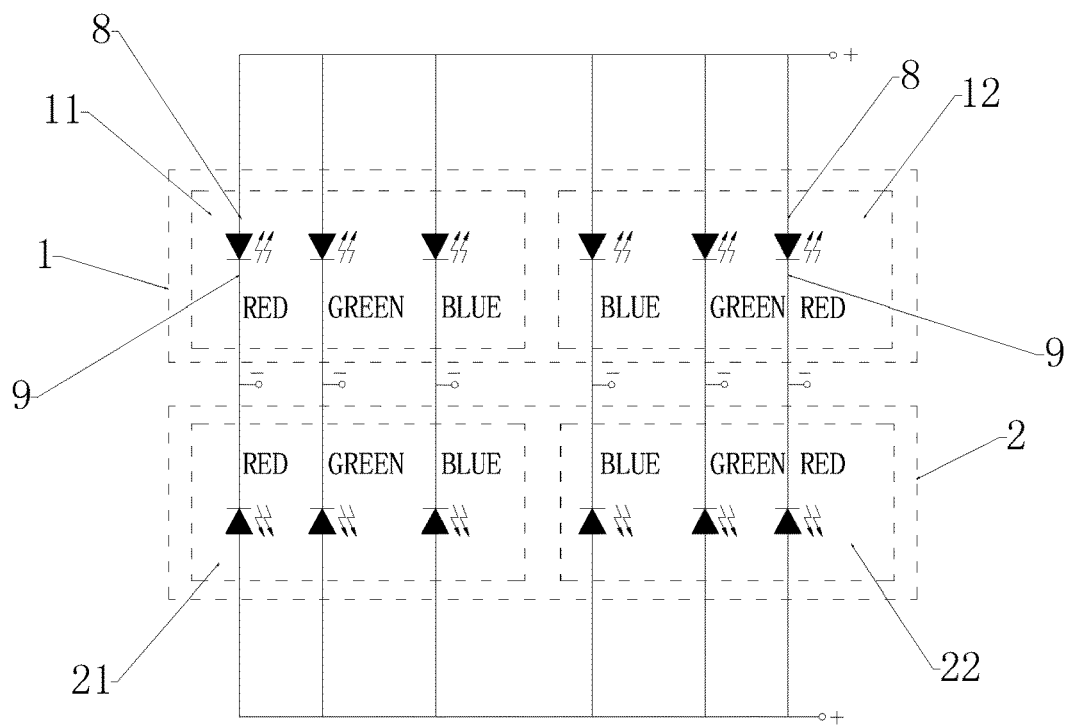
FIG. 7 is an electrical connection diagram of an RGB-LED packaging module provided in the present disclosure.
Figure 8:
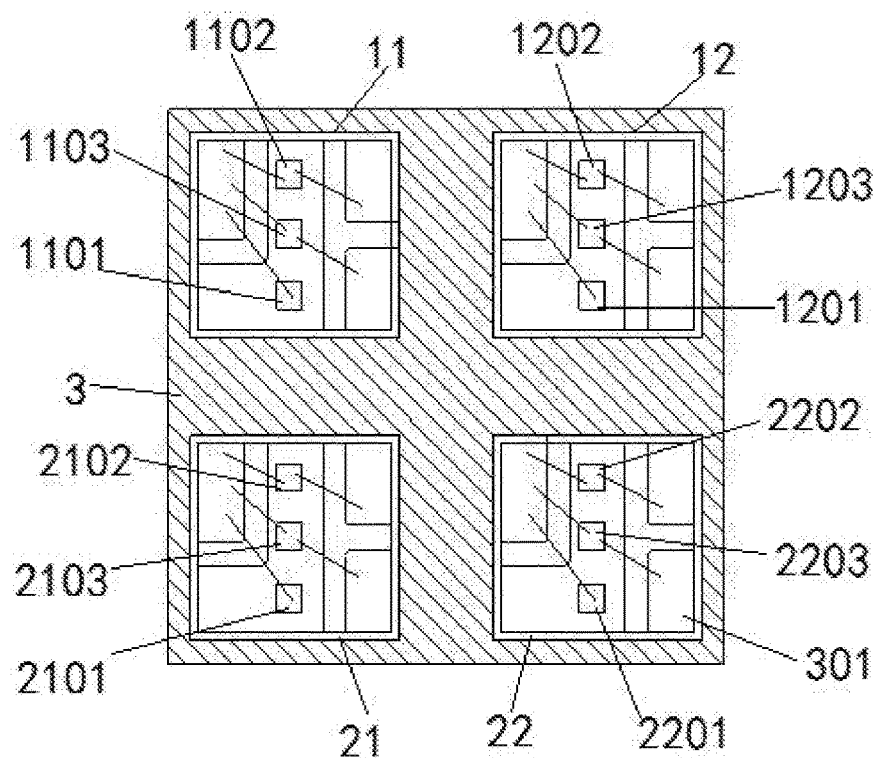
FIG. 8 is a schematic diagram of a front side of an RGB-LED packaging module provided in the present disclosure.
Figure 9:
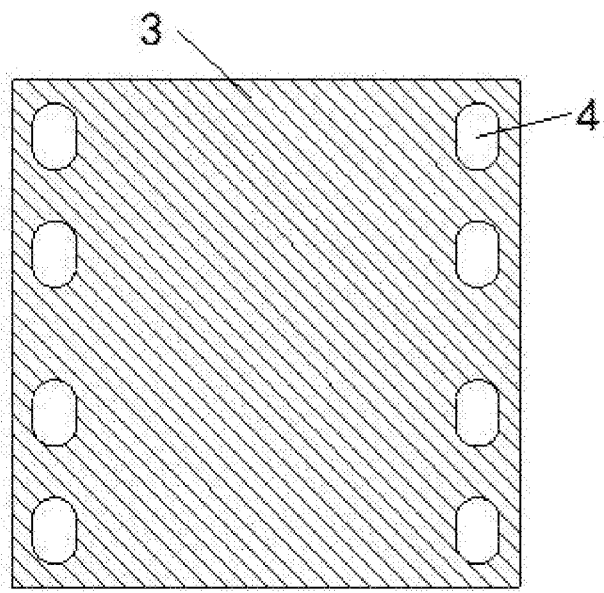
FIG. 9 is a schematic diagram of a back side of an RGB-LED packaging module provided in the present disclosure.

To solve this problem, referring to FIG. 7 to FIG. 9, the present disclosure provides an RGB-LED packaging module which may include a substrate 3 and four light-emitting units disposed on the substrate 3. In the present embodiment, the four light-emitting units may include a first light-emitting unit 11, a second light-emitting unit 12, a third light-emitting unit 21, and a fourth light-emitting unit 22. Each of the light-emitting units may include a set of red light, green light and blue light chips, as shown in the drawings. The first light-emitting unit 11 may include a first red light chip 1101, a first green light chip 1102, and a first blue light chip 1103. The second light-emitting unit 12 may include a second red light chip 1201, a second green light chip 1202, and a second blue light chip 1203. The third light-emitting unit 21 may include a third red light chip 2101, a third green light chip 2102, and a third blue light chip 2103. The fourth light-emitting unit 22 may include a fourth red light chip 2201, a fourth green light chip 2202, and a fourth blue light chip 2203. Each of the chips can be provided with a first electrode 8 and a second electrode 9 for supplying power. The second electrode 9 is opposite in polarity to the first electrode 8. The first electrode 8 may be a common cathode or a common anode, i.e., the first electrode 8 may be used as common cathode or common anode. As shown in FIG. 7, in the present embodiment, the first electrode 8 can be a positive electrode, the second electrode 9 can be a negative electrode, and the first electrode 8 may be used as a common anode. The four light-emitting units may be paired up to form two pairs of light-emitting units, as shown in FIG. 7, namely a first pair of light-emitting units 1 and a second pair of light-emitting units 2. As shown in FIG. 7, one ends of all of the red light chips, green light chips, and blue light chips of each pair of the two pairs of light-emitting units may share one first electrode 8, and the other ends may be one to one corresponding to those of the red light chips, green light chips, and blue light chips of the other pair of light-emitting units, and may share one second electrode 9. That is to say, the first electrodes 8 of all of the red light chips, green light chips, and blue light chips of each pair of the two pairs of light-emitting units may be electrically connected and then connected to the positive electrode of the power source. The second electrodes 9 of the red light chips, green light chips, and blue light chips of one pair of light-emitting units may be one to one corresponding to those of the red light chips, green light chips, and blue light chips of the other pair of light-emitting units. At this time, as shown in FIG. 7, after the electrical connection scheme is adopted, the number of positive pins connected to the first electrode 8 is two, and the number of negative pins connected to the second electrode 9 is six. That is, the total number of electrode pins is only eight. As compared to the number of electrodes of the conventional electrical connection scheme shown in FIG. 6, the number is reduced by two times. As shown in FIG. 9, the back side of the substrate 3 may be provided with a plurality of lower solder pads 4. The first electrode 8 and the second electrode 9 may be led out through the lower solder pads 4 and connected to an external circuit. By adopting the electrical connection method provided in the present disclosure, the number of lower solder pads 4 is decreased by two times as compared with the number of pads of the conventional four connected modules. This can greatly facilitate the soldering process and subsequent circuit design.

The production process of the RGB-LEFD packaging module provided by the present disclosure is as follows:

According to design layout, etching the front and back sides of the substrate 3 to form functional regions 301 and lower solder pads 4 for receiving the chips and realizing electrical connection, boring holes at specific positions on the substrate 3 that pass through the front and back sides thereof, placing chips on the front side of the substrate 3, carrying out die attachment and wire bonding, laying a protective layer on the chips, and cutting the substrate 3 to form the RGB-LED packaging modules of the present disclosure.

In practical applications, there are many different forms of implementation of the above-described connection scheme, and several specific embodiments will be described in detail below. In order to avoid ambiguity, the reference numerals of the devices appearing below are identical to the reference numerals of the devices appearing above, and are considered to have the same or similar functional effects, which will not be specifically described below.

Figure 10:
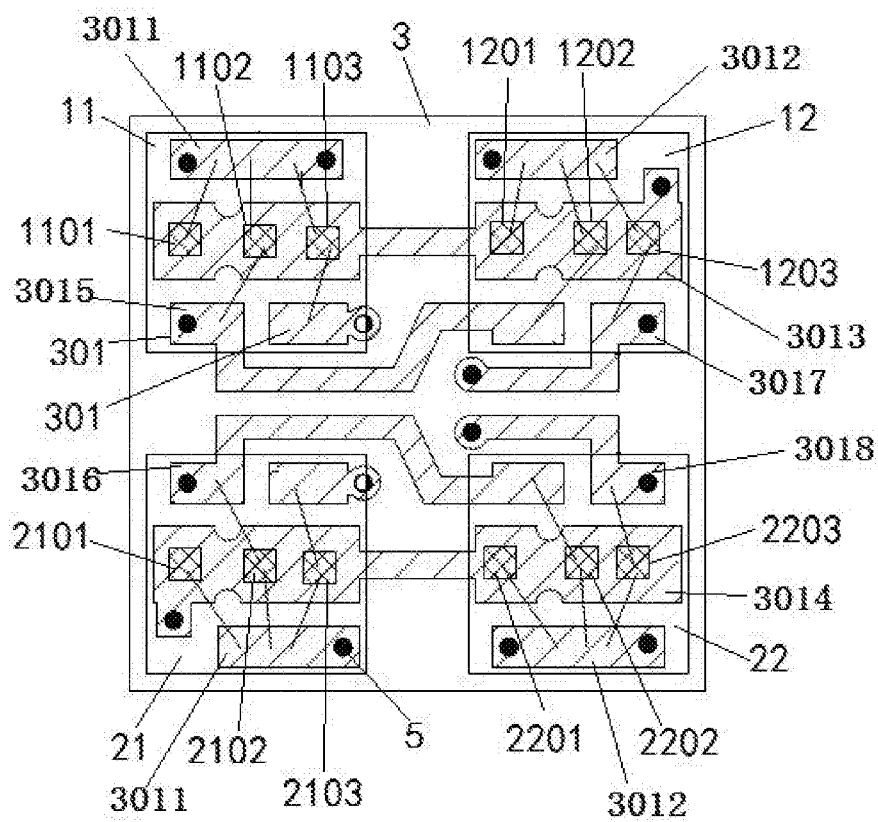
FIG. 10 is a schematic diagram of a front side of another RGB-LED packaging module provided in the present disclosure.
Figure 11:
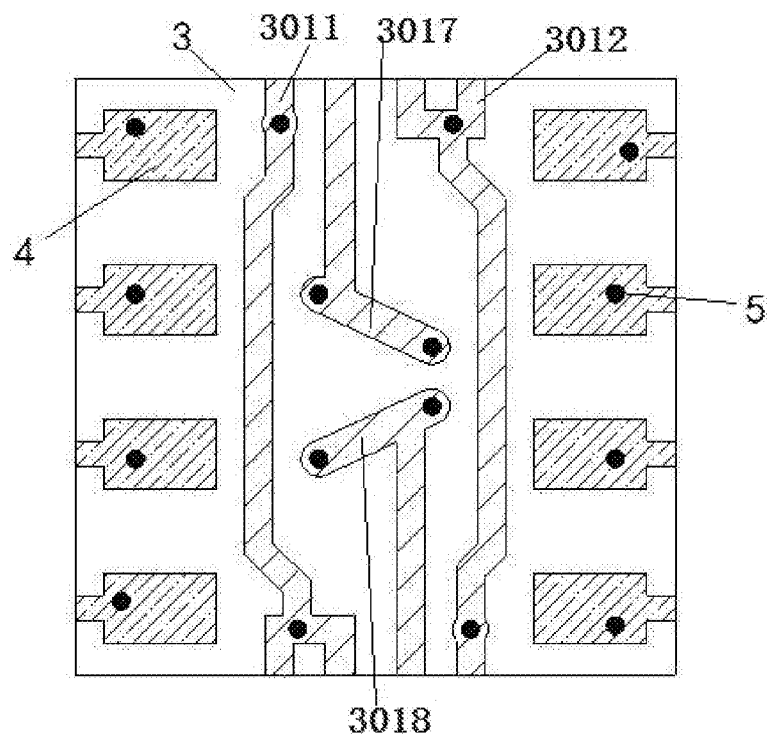
FIG. 11 is a schematic diagram of a back side of another RGB-LED packaging module provided in the present disclosure.

FIGS. 10 and 11 show schematic diagrams of a front side and a back side of the RGB-LED packaging module according to an embodiment of the present disclosure respectively. Four light-emitting units may be disposed on the front side of the substrate 3. Each of the light-emitting units may include a set of red light, green light, and blue light chips. In the present embodiment, the substrate 3 can be a copper clad laminate with copper cladding on the front and back sides. Different functional regions 301 can be etched on the front side for placing RGB-LED chips or forming electrical connections. Taking the first light-emitting unit 11 as an example, as shown in FIG. 10, the first light-emitting unit 11 may have four functional regions 301. One of the functional regions 301 may be placed with a first red light chip 1101, a first green light chip 1102, and a first blue light chip 1103. The first red light chip 1101, the first green light chip 1102, and the first blue light chip 1103 can be electrically connected to the other three functional regions 301 respectively by wire bonding. One of the functional regions 301 may serve as a common polarity region, and may be electrically connected to the three chips. In the present embodiment, as shown in FIGS. 10 and 11, the substrate 3 may be provided with a plurality of through-holes 5 penetrating through the substrate 3. The through-holes 5 can be metal holes to realize electrical connection of the front and back sides the substrate 3. In the present embodiment, the functional regions 301 can be electrically connected to the lower solder pads 4 on the back side of the substrate 3 by the through-holes 5, and at the same time the functional regions 301 on the front and back sides of the substrate 3 can also be electrically connected by the through-holes 5. For example, the functional region 301 of the first light-emitting unit 11 as a common polarity region and the functional region 301 of the third light-emitting unit 21 as a common polarity region can be electrically connected on the back side of the substrate 3 by the through-holes 5. With reference to the electrical connection diagram shown in FIG. 7, in the present embodiment, one ends of the chips of the first light-emitting unit 11 and the third light-emitting unit 21 share the same lower solder pad 4 through the functional regions 301 which are interconnected as common polarity regions, and can be led out as one end of the electrode. The other ends of the chips of the first light-emitting unit 11 may be electrically connected to the other ends of the corresponding chips of the second light-emitting unit 12 through the remaining three functional regions 301. For example, the first red light chip 1101 may be electrically connected to the second red light chip 1201 through the functional region 301 in which the chips are placed, and may share a lower solder pad 4.

As described above, in the present embodiment, through the layout of the functional regions 301, the electrical connection relationship as shown in FIG. 7 can be realized and the number of the lower solder pads 4 can be reduced to eight. As shown in FIG. 11, in the present embodiment, the lower solder pads 4 may be distributed along two sides of the back side of the substrate 3 to facilitate arrangement and cutting.

Figure 12:
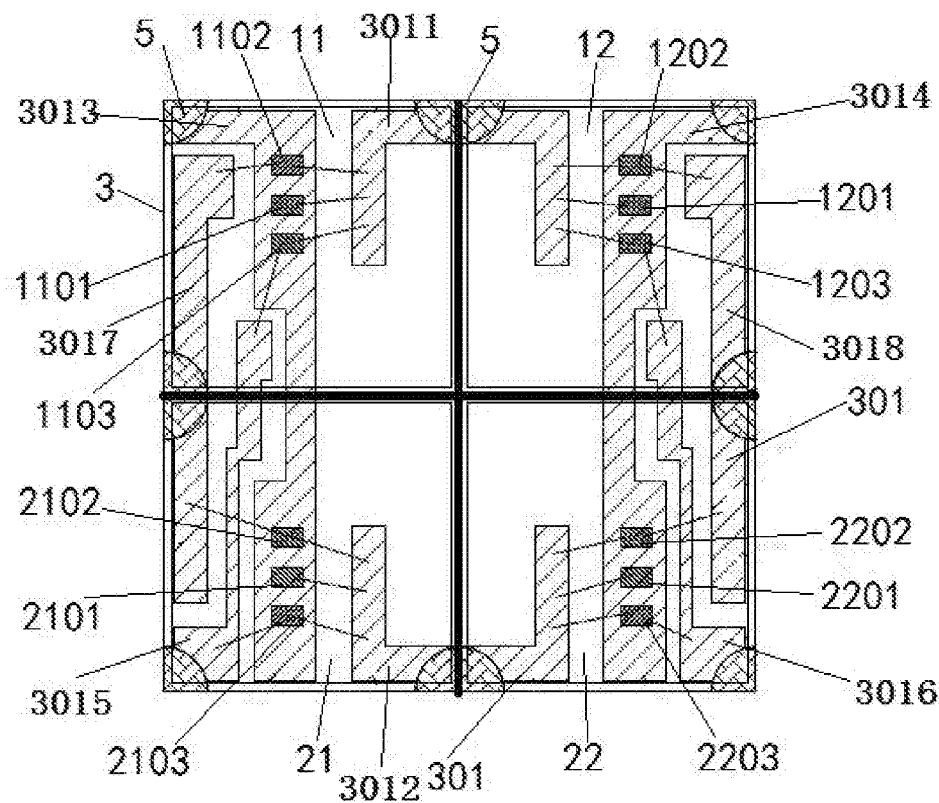
FIG. 12 is a schematic diagram of a front side of another RGB-LED packaging module provided in the present disclosure.
Figure 13:
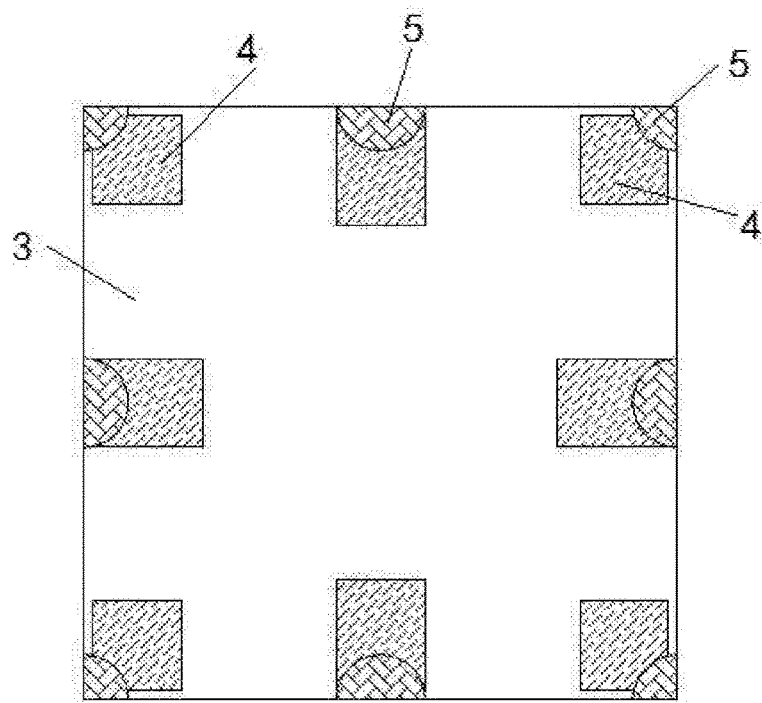
FIG. 13 is a schematic diagram of a back side of another RGB-LED packaging module provided in the present disclosure.

FIGS. 12 and 13 are schematic diagrams of a front side and a back side of an RGB-LED packaging module according to another embodiment of the present disclosure respectively. Its circuit connection is the same as the circuit connection shown in FIG. 7. The specific structures may include:

a substrate 3, the substrate may be having patterning circuit layers provided on a front side of the substrate, the patterning circuit layers including a plurality of functional regions 301, a plurality of lower solder pads 4 provided on a back side of the substrate, each functional region 301 corresponding to one lower solder pad 4 and connected by a conductive hole passing through the substrate, the conductive hole being a through-hole 5;

four light-emitting units 200, the four light-emitting units 200 may be arranged in a square array on the front side of the substrate 3, each light-emitting unit 200 including a red-light chip, a blue light chip and a green light chip;

a light-transmitting plastic layer 300, the light-transmitting plastic layer 300 may be wrapping around the four light-emitting units 200 on the substrate 3;

wherein the functional regions 301 may include first and second red light chip connecting regions, first and second blue light chip connecting regions, first and second green light chip connecting regions, and first and second common polarity regions, each chip of the light-emitting units 200 may be provided with a first electrode 8 and a second electrode 9, the second electrode 9 is opposite in polarity to the first electrode 8, wherein the first electrodes 8 of all of the chips in a first row of the light-emitting units 200 may be electrically connected to the first common polarity region 3011, the first electrodes 8 of all of the chips in a second row of the light-emitting units 200 may be electrically connected to the second common polarity region 3012, the second electrodes 9 of the red light chips in a first column of the light-emitting units may be electrically connected to the first red light chip connecting region 3013, the second electrodes 9 of the red light chips in a second column of the light-emitting units may be electrically connected to the second red light chip connecting region 3014, the second electrodes 9 of the blue light chips in the first column of the light-emitting units may be electrically connected to the first blue light chip connecting region 3015, the second electrodes 9 of the blue light chips in the second column of the light-emitting units may be electrically connected to the second blue light chip connecting region 3016, the second electrodes 9 of the green light chips in the first column of the light-emitting units may be electrically connected to the first green light chip connecting region 3017, the second electrodes 9 of the green light chips in the second column of the light-emitting units may be electrically connected to the second green light chip connecting region 3018.

In practical applications, the substrate 3 can be a printed circuit board (PCB), a copper clad laminate, an FR-4 board or other types of printed circuit boards. Preferably, the substrate 3 can be a double-sided copper clad board with a middle layer of insulating material. A patterned circuit layer may be formed on the front side of the substrate by etching or other process, and lower solder pads 4 can be formed on the back side of the substrate.

The patterned circuit layer can be used to carry the light-emitting units and form an electrical connection, and it can be adjusted according to different circuit connection requirements. In the embodiment shown in FIG. 10 and FIG. 11, the circuit connection can be achieved by the circuit layers on the front and back sides of the substrate. However, if the circuit layers are provided on the back side of the substrate, short circuit is likely to occur during soldering and affect the yield of the product. In order to solve this problem, an insulating solder-resist layer may be coated on the back surface of the substrate to cover the circuits on the back surface of the substrate to avoid the influence. However, this is undoubtedly an increase in the production process, and the corresponding costs will also be increased. Therefore, the present disclosure preferably provides a patterned circuit layer on the front side of the substrate, and the electrical connection of the light-emitting units can be completely realized by the patterned circuit layer on the front side of the substrate, as shown in the embodiment shown in FIGS. 12 and 13. It can effectively solve the basic problem of wiring on the back side.

The patterned circuit layer and the lower solder pads 4 may be connected by the conductive holes (through-holes 5) penetrating through the substrate 3. The conductive holes can be formed by a boring process that is commonly known in the art. The position of the conductive holes can be adjusted according to the design of the patterned circuit layer. In the embodiment shown in FIGS. 12 and 13, the through-holes 5 are conductive holes according to the present embodiment, and the conductive holes may be located along the edges of the substrate 3 and may have a semi-circle or a quarter circle cross section. The purpose of this design is that in actual production, adjacent packaging modules can share the conductive holes, and the substrate can be cut at the time of production to form the modules. This can effectively reduce the number of conductive holes and simplify the process. Preferably, in actual production, the conductive materials, such as ink, resin, etc., may be filled in the conductive holes, so that the light-transmitting plastic layer 300 cannot enter the conductive holes when the light-transmitting plastic layer 300 is molded.

The four light-emitting units may be arranged in a square array on the front side of the substrate 3, so as to ensure the consistency of the four light-emitting units. Each of the light-emitting units has two cutting edges and two adjacent sides. The square design is also convenient for subsequent installation. Each of the light-emitting units may include a red light chip, a green light chip, and a blue light chip. Of course, the number of the red light chip, the green light chip, and the blue light chip is not specified as only one. The number of the chips may be more than one. For example, each light-emitting unit may be provided with two red light chips, one green light chip and one blue light chip, or it may be provided with one red light chip, one green light chip and one blue light chip. The types of the red light chip, green light chip, and blue light chip can be a double-electrode chip, a single-electrode chip, or a flip chip. Preferably, the red light chip is a single electrode chip, i.e., the structure of a vertical chip. The electrodes may be located on the upper and lower sides of the chip. The green light chip and the blue light chip can be a double-electrode chip, i.e., the structure of an upright chip, and the two electrodes may be located on the top side of the chip. This structure combination is currently popular in the market, and its corresponding production cost is low.

Figure 16:
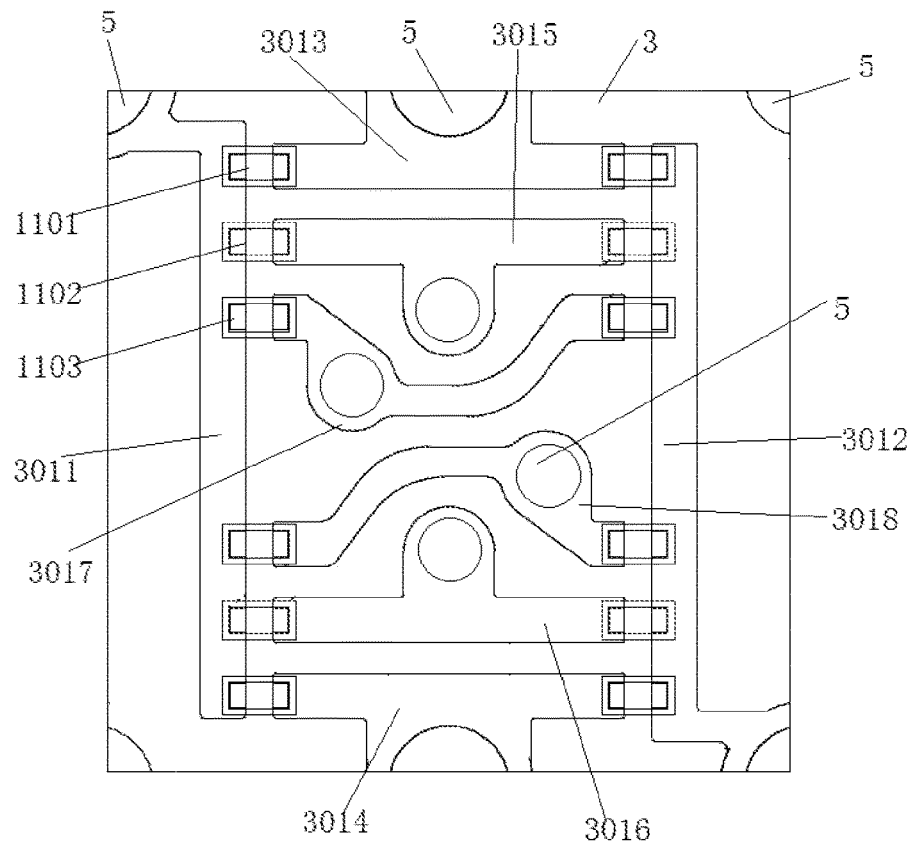
FIG. 16 is a schematic diagram of a front side of a flip chip RGB-LED packaging module provided in the present disclosure.
Figure 17:
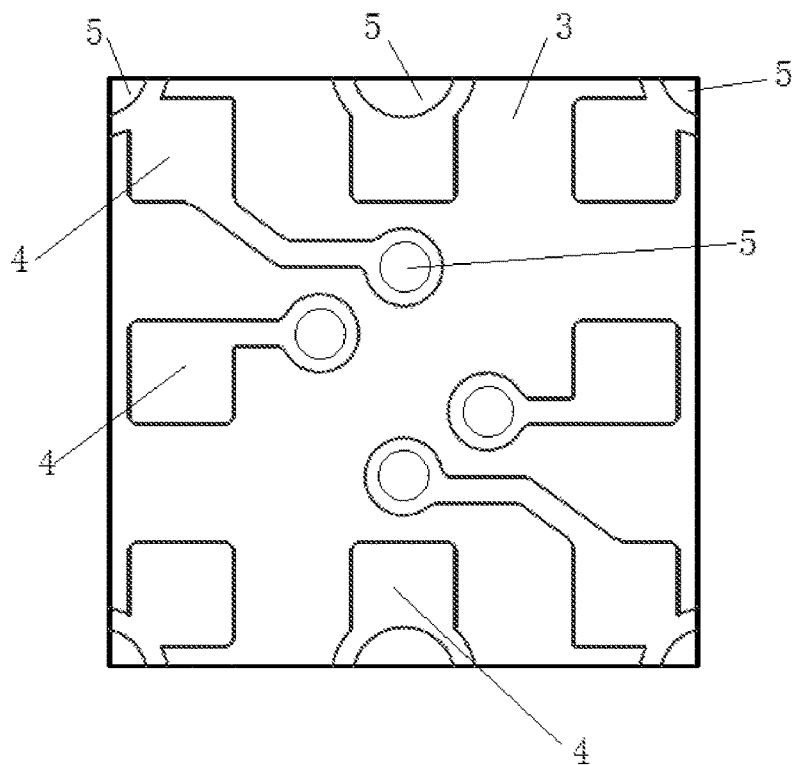
FIG. 17 is a schematic diagram of a back side of a flip chip RGB-LED packaging module provided in the present disclosure.

Furthermore, referring to the embodiment shown in FIG. 16 and FIG. 17, the RGB-LED chips can be all flip chips, i.e., both electrodes of the chip are located at the bottom of the chip, and the chip can be directly soldered to the patterning circuit layer. There is no need to solder the wires, and it can avoid the possibility of wire damage. This can effectively enhance the reliability of the packaging module, and the electrodes on the top surface of the chip can enhance the light-emitting effect.

The light-transmitting plastic layer 300 can be molded onto the substrate 3 by a molding process to cover the four light-emitting units. On one hand, the presence of the light-transmitting plastic layer 300 can protect the light-emitting units, strengthen the mechanical strength of the packaging module, and on the other hand, it can mix the light emitted by the three kinds of chips in the light-emitting units to ensure the light-emitting effect of the light-emitting units.

Figure 14:
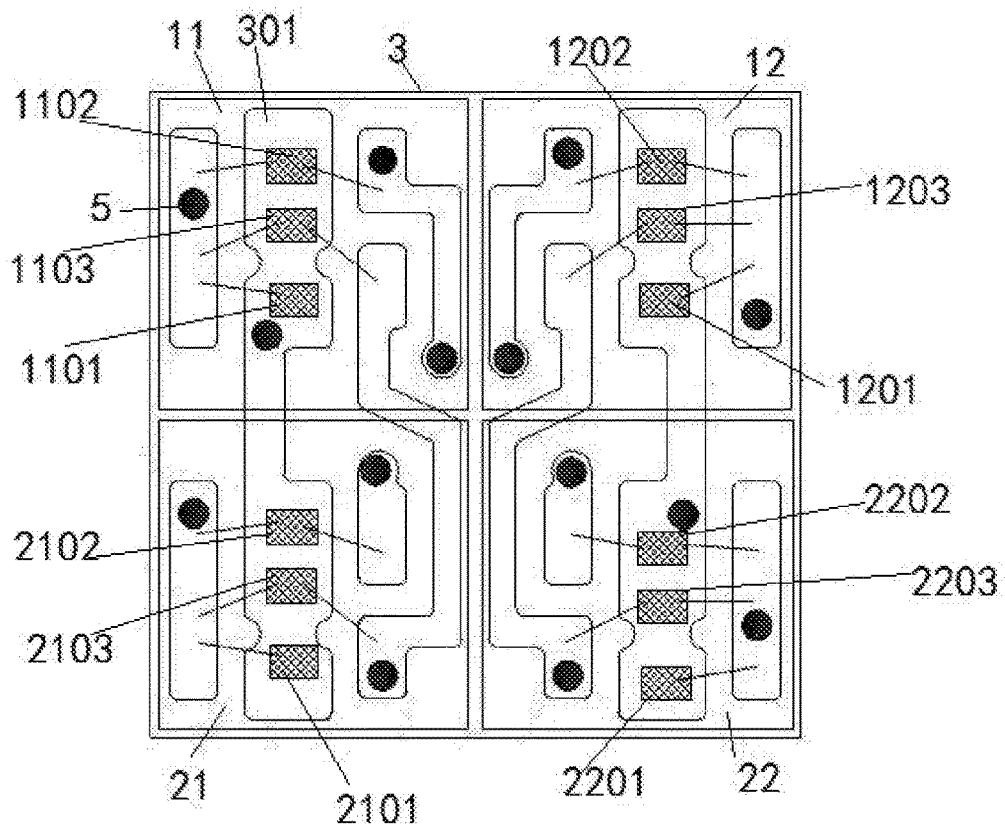
FIG. 14 is a schematic diagram of a front side of another RGB-LED packaging module provided in the present disclosure.
Figure 15:
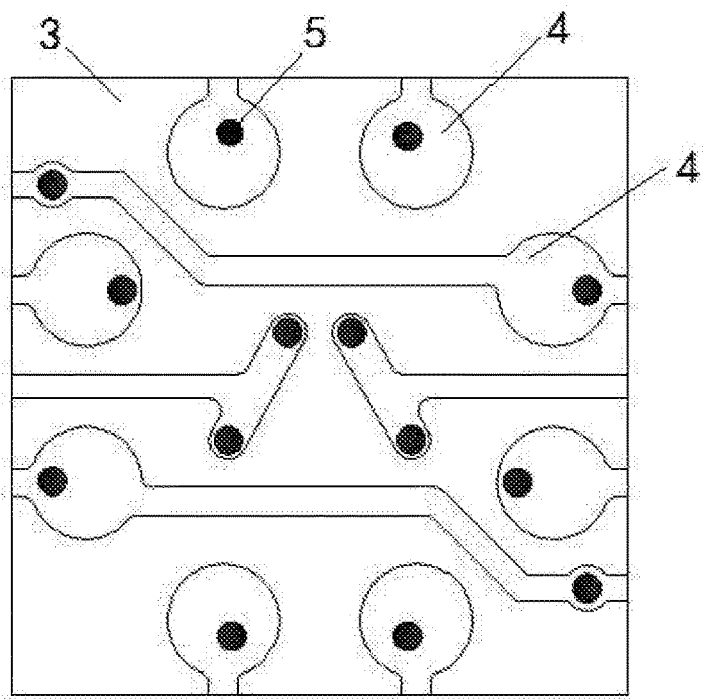
FIG. 15 is a schematic diagram of a back side of another RGB-LED packaging module provided in the present disclosure.

FIGS. 14 and 15 show schematic views of the front and back sides of another embodiment of the RGB-LED packaging module of the present disclosure. Four light-emitting units may be disposed on the front side of the substrate 3. Each of the light-emitting units may include a set of red light, green light, and blue light chips. In the present embodiment, different functional regions 301 may also be provided on the front side of the substrate 3. As shown in FIG. 14, the functional region 301 of the first light-emitting unit 11 as a common polarity region and the functional region 301 of the second light-emitting unit 12 as a common polarity region can be electrically connected on the front side of the substrate 3. The functional region 301 of the third light-emitting unit 21 as a common polarity region and the functional region 301 of the fourth light-emitting unit 22 as a common polarity region can be electrically connected on the front side of the substrate 3. The functional regions 301 can be electrically connected to the lower solder pads 4 on the back side of the substrate 3 by the through-holes 5.

In the present embodiment, all of the lower solder pads 4 can be located in the back surface of the substrate 3, and not close to the edges of the substrate 3. The present disclosure does not limit the specific shape of the connecting circuits. The connection shape and manner can have various improvements and changes. Similarly, the position of the lower solder pads 4 is also not limited. The lower solder pads 4 can be located within the substrate 3, or around the edges of the substrate 3. These modifications should also fall within the scope of the appended claimed.

Figure 18:
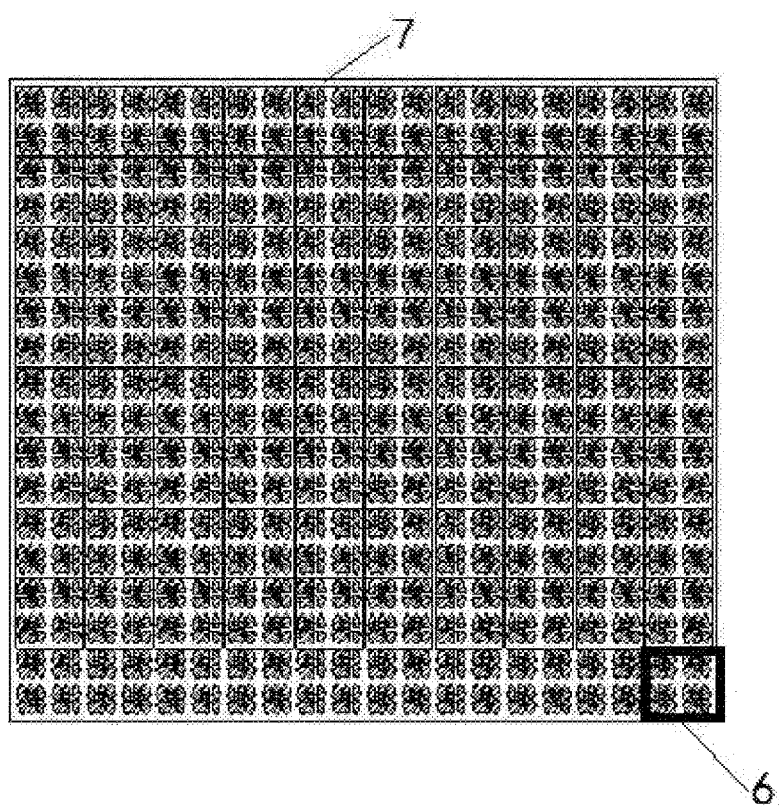
FIG. 18 is a schematic diagram of an RGB-LED display screen provided in the present disclosure.

Referring to FIG. 18, the present disclosure also provides an RGB-LED display screen having the above-mentioned RGB-LED packaging modules. Preferably, the spacing of the isolating trough 500 is equal to the spacing between the RGB-LED packaging modules, so that the overall appearance of the entire RGB-LED display screen 7 is more uniform, and a single LED pixel is produced in appearance.

The RGB-LED packaging module and the display screen provided by the present disclosure make use of a black light-absorbing layer to absorb light which causes interference among the light-emitting units. By providing a virtual isolating region and an isolating trough, and utilizing the difference of refractive index of the packaging plastic and the refractive index of air, light emitted by the light-emitting units can be reflected so as to reduce the influence on adjacent light-emitting units. Further, the black isolating frame is filled in the isolating trough to minimize the interference among the light-emitting units.

It is to be understood that the present disclosure is not limited to the above-described embodiments. The person skilled in the art can make modifications and changes based on the above description, all of which are within the scope of the appended claims.

What is claimed is:

1. An RGB-LED packaging module, comprising a substrate; a plurality of light-emitting units disposed on the substrate, each light-emitting unit comprising a set of RGB-LED chips; a plastic layer provided on the light-emitting units; and a virtual isolating region provided between the light-emitting units, the virtual isolating region comprising a dark light-absorbing layer provided on the substrate; the number of the light-emitting units is four, and the RGB-LED chip comprises a set of red light, green light and blue light chips, each chip being provided with a first electrode and a second electrode for supplying power, the first electrode having common anodes or common cathodes, the second electrode having an opposite polarity of the first electrode, wherein the four light-emitting units are paired up to form two pairs of light-emitting units, the first electrodes of all of the red light chips, green light chips and blue light chips of each pair of light-emitting units are electrically connected, and the second electrodes of one pair of light-emitting units are electrically connected in one-to-one correspondence with the second electrodes of the red light chips, green light chips and blue light chips of the other pair of light-emitting units; a back side of the substrate is provided with a plurality of lower solder pads; and the first electrodes and the second electrodes are led out through the lower solder pads and connected to an external circuit.

2. The RGB-LED packaging module as claimed in claim 1, wherein the dark light-absorbing layer is in one of colors black, dark gray, dark purple, green black, dark blue and dark brown.

3. The RGB-LED packaging module as claimed in claim 2, wherein the dark light-absorbing layer is a black light-absorbing layer, and the black light-absorbing layer comprises carbon black, graphite, carbon nanotube, melanin, iron black, graphene, other black light-absorbing material of a same type, or a combination thereof.

4. The RGB-LED packaging module as claimed in claim 3, wherein the virtual isolating region further comprises an isolating trough disposed between the light-emitting units.

5. The RGB-LED packaging module as claimed in claim 4, wherein the virtual isolating region further comprises a black isolating frame filled in the isolating trough.

6. The RGB-LED packaging module as claimed in claim 5, wherein the black isolating frame has a width and a height that are consistent with those of the isolating trough, and the black isolating frame is mixed with one or more of carbon black, graphite, carbon nanotubes, melanin, iron black, and graphene.

7. The RGB-LED packaging module as claimed in claim 1, wherein the RGB-LED chip is an upright chip, a vertical chip, or a flip chip, and comprises a red-light chip, a green light chip, and a blue light chip.

8. The RGB-LED packaging module as claimed in claim 1, wherein a front side of the substrate relates to the plurality of lower solder pads through a plurality of conductive hole passing through the substrate.

9. The RGB-LED packaging module as claimed in claim 8, wherein the substrate is a multi-layered board, and at least one circuit layer is disposed in the substrate, wherein the front side of the substrate, the lower solder pads, and the circuit layer are electrically connected through the conductive holes.

10. An RGB-LED packaging module, comprising:
a substrate, the substrate comprising a plurality of functional regions provided on a front side of the substrate, a plurality of lower solder pads provided on a back side of the substrate, each functional region corresponding to one lower solder pad and connected through a conductive hole passing through the substrate;
four light-emitting units, the four light-emitting units arranged in a square array on the front side of the substrate, each light-emitting unit comprising a red-light chip, a blue light chip and a green light chip; and
a light-transmitting plastic layer, the light-transmitting plastic layer being wrapped around the four light-emitting units on the substrate;
wherein the functional regions include first and second red light chip connecting regions, first and second blue light chip connecting regions, first and second green light chip connecting regions, and first and second common polarity regions, each chip of the light-emitting units being provided with a first electrode and a second electrode, the second electrode being opposite in polarity to the first electrode, wherein the first electrodes of all of the chips in a first row of the light-emitting units are electrically connected to the first common polarity region, the first electrodes of all of the chips in a second row of the light-emitting units are electrically connected to the second common polarity region, the second electrodes of the red light chips in a first column of the light-emitting units are electrically connected to the first red light chip connecting region, the second electrodes of the red light chips in a second column of the light-emitting units are electrically connected to the second red light chip connecting region, the second electrodes of the blue light chips in the first column of the light-emitting units are electrically connected to the first blue light chip connecting region, the second electrodes of the blue light chips in the second column of the light-emitting units are electrically connected to the second blue light chip connecting region, the second electrodes of the green light chips in the first column of the light-emitting units are electrically connected to the first green light chip connecting region, and the second electrodes of the green light chips in the second column of the light-emitting units are electrically connected to the second green light chip connecting region.

11. The RGB-LED packaging module as claimed in claim 10, wherein a virtual isolating region is provided between the light-emitting units, and the virtual isolating region comprises a dark light-absorbing layer provided on the substrate.

12. The RGB-LED packaging module as claimed in claim 10, wherein the red-light chip has a structure of a vertical chip, and the green light chip and the blue light chip have a structure of an upright chip.

13. The RGB-LED packaging module as claimed in claim 12, wherein all of the chips of the two light-emitting units in the first column are die-attached on the first red light chip connecting region; and all of the chips of the two light-emitting units in the second column are die-attached on the second red light chip connecting region.

14. The RGB-LED packaging module as claimed in claim 12, wherein all the chips of the two light-emitting units in the first row are die-attached on the first common polarity region; and all the chips of the two light-emitting units in the second row are die-attached on the second common polarity region.

15. The RGB-LED packaging module as claimed in claim 10, wherein the red-light chips, the blue light chips, and the green light chips are flip chips.

* * * * *